United States Patent
Serra et al.

(10) Patent No.: US 8,901,941 B2
(45) Date of Patent: Dec. 2, 2014

(54) INSTRUMENT AND METHOD FOR DETECTING PARTIAL ELECTRICAL DISCHARGES

(75) Inventors: Stefano Serra, San Vittore Olona (IT); Gian Carlo Montanari, Casalecchio di Reno (IT); Fabiano Bettio, Monte San Pietro (IT)

(73) Assignee: Techimp Technologies S.R.L., Bologna (IT)

( * ) Notice: Subject to any disclaimer, the term of this patent is extended or adjusted under 35 U.S.C. 154(b) by 320 days.

(21) Appl. No.: 13/581,753

(22) PCT Filed: Mar. 4, 2011

(86) PCT No.: PCT/IB2011/050925
§ 371 (c)(1),
(2), (4) Date: Aug. 29, 2012

(87) PCT Pub. No.: WO2011/110986
PCT Pub. Date: Sep. 15, 2011

(65) Prior Publication Data
US 2012/0319703 A1 Dec. 20, 2012

(30) Foreign Application Priority Data
Mar. 10, 2010 (IT) .............................. BO2010A0143

(51) Int. Cl.
*G01R 27/28* (2006.01)
*G01R 31/12* (2006.01)

(52) U.S. Cl.
CPC .................................. *G01R 31/1227* (2013.01)
USPC ....................................................... 324/649

(58) Field of Classification Search
CPC ........ G01R 1/00; G01R 2019/00; G01R 5/00; G01R 7/00; G01R 9/00; G01R 11/00; G01R 21/00; G01R 22/00; G01R 23/00; G01R 27/00; G01R 31/00; G01R 33/00; G01R 35/00
USPC ....................................................... 324/649
See application file for complete search history.

(56) References Cited

U.S. PATENT DOCUMENTS 3,882,380 A * 5/1975 Black ............................. 324/679
5,323,117 A * 6/1994 Endoh et al. ................... 324/551
(Continued)

FOREIGN PATENT DOCUMENTS

CN 1274849 A 11/2000
DE 36 35 611 A1 4/1988
(Continued)

OTHER PUBLICATIONS

International Electrotechnical Commission, "IEC 60270. International Standard. High-Voltage Test Techniques—Partial Discharge Measurements". 3rd Edition, 2000-2012, International Electrotechnical Commission, Geneva, Switzerland, Dec. 2000, pp. 1-99 (odd numbers only).
(Continued)

*Primary Examiner* — Huy Q Phan
*Assistant Examiner* — Temilade S Rhodes-Vivour
(74) *Attorney, Agent, or Firm* — Pearne & Gordon LLP (57) ABSTRACT

An instrument (1) and a method for detecting partial electric discharges involve acquiring a discharge signal (10), for example picked up by a direct-measuring impedance device (7) through a broadband HF acquisition channel (18), and acquiring the discharge signal (10) in a narrowband LF acquisition channel (180) complying with regulations, using on the LF acquisition channel (180) a trigger controlled in slave mode by a trigger of the broadband HF acquisition channel (18); they also involve acquiring another discharge signal (32) picked up by an indirect-measuring impedance device (8) through a second narrowband LF acquisition channel (180A) and comparing digital signals (34, 34A) generated in the first and second LF acquisition channels (180, 180A), in order to generate a balanced digital signal (36) without components representative of common mode electrical signals present in the measuring circuit.

10 Claims, 3 Drawing Sheets

(56) References Cited

U.S. PATENT DOCUMENTS

| | | | |
|---|---|---|---|
| 5,680,059 A | 10/1997 | Shiota et al. | |
| 5,828,227 A | 10/1998 | Shiota et al. | |
| 5,973,500 A | 10/1999 | Moreau et al. | |
| 6,313,640 B1 | 11/2001 | Nasrallah et al. | |
| 6,452,416 B1 | 9/2002 | Kaneda et al. | |
| 7,285,961 B2 | 10/2007 | Shinmoto et al. | |
| 8,098,072 B2 * | 1/2012 | Twerdochlib | 324/536 |
| 8,447,540 B2 | 5/2013 | Montanari et al. | |
| 2004/0246000 A1 * | 12/2004 | Kuppuswamy | 324/536 |
| 2009/0012727 A1 | 1/2009 | Siew et al. | |
| 2011/0012586 A1 | 1/2011 | Montanari et al. | |
| 2012/0319703 A1 | 12/2012 | Serra et al. | |
| 2012/0330583 A1 | 12/2012 | Serra et al. | |

FOREIGN PATENT DOCUMENTS

| | | |
|---|---|---|
| EP | 0 813 282 B1 | 12/1997 |
| EP | 1 645 887 A2 | 4/2006 |
| GB | 2 066 967 A | 7/1981 |
| WO | 2005121821 | 12/2005 |
| WO | 2007/144789 A2 | 12/2007 |
| WO | 2009/013640 A1 | 1/2009 |
| WO | 2009013639 A1 | 1/2009 |
| WO | 2011110984 A1 | 9/2011 |
| WO | 2011110986 A1 | 9/2011 |

OTHER PUBLICATIONS

Schaper, et al., "Synchronous Multi-Terminal On-Site PD Measurements on Power Transformers", Proceedings of the XIVth International Symposium on High Voltage Engineering, Tsinghua Unversity Press, Beijing, China, 2005., No. G-121, 2005, p. 1-6.

Zhang, et al., "A Novel On-Line Differential Technique for Partial Discharge Measurement of MV/HV Power Cables", 8th International Conference on Properties and Application of Dielectric Materials (ICPADM), Grand Bali Beach Hotel, Bali, Indonesia, 2006, pp. 641-644.

Omicron Mtronix Technology, "MPD 600. Partial Discharge Analysis System", Omicron Electronics GmbH, Apr. 2008, pp. 1-20.

* cited by examiner

INSTRUMENT AND METHOD FOR DETECTING PARTIAL ELECTRICAL DISCHARGES

TECHNICAL FIELD

This invention relates to an instrument and a method for detecting partial electrical discharges.

It should be noted that a partial discharge is an electric discharge limited to a portion of the insulation of an electrical apparatus and does not therefore cause immediate failure of the apparatus but its gradual degradation. By their very nature, therefore, partial discharges are substantially limited in extent to a defect in the insulating system. In light of this, diagnostic methods based on the detection and interpretation of partial discharges are among the most promising and widely studied in the context of scientific research since the study of partial discharges makes it possible to investigate the nature of defects in the insulating system where the discharges occur.

The detection and processing of partial discharges for diagnostic purposes, however, has not yet become a standard industrial tool for planning the maintenance and/or substitution of high-voltage electrical components on account of the difficulties encountered in interpreting the results of measurements.

BACKGROUND ART

As regards the detection of partial discharges, several methods have been developed, based on the use of different physical phenomena associated with discharges, such as, for example, methods of optical, acoustic and electrical type.

This invention relates in particular to detection methods of the electrical type which, as is known, involve measuring the current pulses that travel a detection circuit coupled to the electrical system being checked.

These detected current pulses (hereinafter referred to, for convenience, as discharge pulses) have a time profile that depends on the dynamics of the partial discharges (that is, on the physics of the discharge phenomena) and on the nature of the means which the detected pulses cross as they travel from the discharge site (where the discharges occur) to the detection site. The time profile of the discharge pulses, consisting of the waveform of the pulses themselves, contains precious diagnostic information regarding both the physical phenomena associated with the discharges (correlated with the nature of the defects of the insulating system) and the nature of the medium which the detected pulses travel through (correlated with the location of the defects in the insulating system).

As to the difficulties of interpreting the results of partial discharge measurements, these depend on the fact that the measured data may be unreliable or insignificant.

In effect, during detection of the signals associated with the partial discharges, information essential for subsequent processing of the signals themselves for diagnostic purposes may be lost (loss of information might consist, for example, of failure to detect a pulse or failure to detect the waveform of a pulse).

Considering that the discharge pulses contain information that can be used at diagnostic level, it would be very important to detect the pulses in a very wide detection band, for example in the order of ten MHz or more, or at least several Mhz.

It should be noted, however, that the signals detected are current pulses which are correlated with load transfers that occur in the defects in the electrical apparatus being checked and constitute the partial discharges, but they do not constitute a direct measurement of the load transfers.

Thus, to be able to estimate the intensity of a partial discharge corresponding to a signal detected, it is necessary to calibrate the acquisition instrument in order to determine the amplitude of the signals measured by the instrument and the load transfer associated with the partial discharges corresponding to those signals.

For that purpose, a calibrator is applied to the terminals of the apparatus in order to inject into the apparatus a current pulse having suitable characteristics. More specifically, the calibrator is designed to generate the current pulse that would be generated by the transfer of a predetermined load quantity across the terminals. Therefore, an apparent load value equal to the predetermined load value is assigned to a signal detected by the apparatus corresponding to the current pulse injected by the calibrator. The ratio between the predetermined apparent load value and the value of the amplitude of the detected signal constitutes the required calibration factor.

The discharge signals detected on an electrical apparatus are therefore associated with corresponding apparent charge values by multiplying the amplitudes of the signals by the calibration factor previously determined for that apparatus during calibration.

In light of this, it should be noted that the amplitude of the signals detected and the assignment to these signals of corresponding apparent charge values is influenced by the detection bandwidth.

It should therefore be noted that the signals detected by instruments having a very wide bandwidth cannot be compared in amplitude with signals detected on the same apparatus by instruments having a narrow bandwidth, even if each instrument has been calibrated.

Indeed, standards on the subject of partial discharge detection specify the passband values admissible for the input stages of measuring instruments.

For example, at European level, IEC 60270 lays down specifications for detection instruments in order to make the measurement results comparable and consistent. This standard thus specifies the characteristics of PD measuring instruments and also specifies how to test their performance.

More specifically, that standard lays down the specifications for the passband of the detection instruments; the standard recommends that low cut-off frequency (f1) should be between 30 and 100 kHz, that high cut-off frequency (f2) should be less than 500 kHz and that the bandwidth value (f2−f1) should be within the range of between 100 and 400 kHz, these frequency values to be measured at an attenuation of 6 dB relative to the band centre.

Accordingly, the standard states that instruments with a particularly wide detection bandwidth (greater than a few MHz) cannot be calibrated in compliance with the standard.

Thus, on the one hand, there is the need for a detection instrument having a detection bandwidth that is as wide as possible, so as to allow subsequent diagnostic processing (for example to distinguish between discharge pulse waveforms from disturbance signals or to separate signals relating to discharges that occur at different discharge sites); and on the other hand, there is a need to use an instrument with a limited detection bandwidth in order to quantify the signals detected in a way that complies with the standard.

In light of this, prior art solutions (known for example from patent documents U.S. Pat. No. 6,313,640 and EP0813282) teach the use of either broadband or narrowband instruments. More specifically, analogue filters are used which can be applied to the input stage of a broadband instrument to adapt it to the standard, thereby converting it, in practice, into a narrowband instrument.

In other cases, two instruments in parallel or in series are used, one broadband and one narrowband, but without the possibility of comparing the results in compliance with the standard and with evident waste of time and resources.

The problem of simultaneous measurement of pulses in broadband (to maintain the information useful for diagnostic processing) and in narrowband (to be able to assign to the signals a pC amplitude value that complies with the standard, that is to say, that can be compared with results of other instruments) is also dealt with in patent document WO2009/013640 to the same Applicant. In that document, a digital passband filter implemented via software is used to convert the digital discharge signal detected in broadband into a digital signal corresponding to the digital signal that would have been detected if the input stage had the desired bandwidth (compliant with the standard). This filtered digital signal is sent to an output stage together with the unfiltered digital signal so that the output stage can compare the data of the two signals (filtered and unfiltered) relating to the same pulses.

The latter solution, too, is not free of disadvantages, however.

In effect, a digital filter of that kind is complex to make and also requires expensive components.

Another problem in measuring partial discharges lies in the fact that the signals detected do not always correspond to the partial discharges but often include components corresponding to noise.

In particular, the measuring circuit often includes signal components relating to common mode noise (consisting of homopolar components) due to noise which couples to the measuring circuit through earth.

In light of this, attention is drawn to the following with regard to the partial discharge measuring circuit.

The measuring circuit includes a capacitor (called coupling capacitor) connected in parallel to the measuring impedance device to form a low-impedance grid for the signals with a high frequency content.

The measuring circuit also comprises a measuring impedance device across whose terminals the measurement signal is picked up.

The measuring impedance device is usually connected in series with the electric apparatus (in which case it is called direct-measuring impedance device), that is to say, it is connected across a low-voltage terminal of the electric apparatus and an earth node. Alternatively, the measuring impedance device is connected in series with the coupling capacitor (in which case it is called indirect-measuring impedance device), that is to say, it is connected across the earth node and a low-voltage terminal of the coupling capacitor.

Several methods are known which are used to try to "clean up" the electrical discharge signal by removing the noise components from it to leave only the components relating to the partial discharge pulses.

Some methods (described by the Applicant for example in patent document WO2007/144789) involve complex calculations to be applied to the acquired data.

Thus, for each pulse detected, it is necessary to extract one or more shape parameters and, as a function of these, to separate the acquired signals to form groups of signals that are uniform in terms of signal waveform. This is based on the assumption that the waveform of a detected signal is correlated with the source that generated the signal itself (through the transfer function that signal is subjected to as it is transferred from the source to the detection site).

These methods may be quite effective but have the disadvantage of requiring considerable resources in terms of computation capacity and time. Moreover, these methods necessitate acquiring the signals with an ultra wide band (more than ten MHz, for example) to be able to extract these shape parameters in a significant manner.

Also known (for example from DE3635611A1) are analogue partial discharge measuring instruments which allow a "transitional" measurement to be made, that is to say a differential measurement between the signals picked up at the terminals of the direct- and indirect-measuring impedance devices.

In this light, patent document GB2066967 regards an instrument for detecting partial discharges in an electric apparatus, in particular when said apparatus is connected to a measuring circuit having a direct-measuring impedance device connected across a low-voltage terminal of the electrical apparatus and an earth node, and an indirect-measuring impedance device connected across the earth node and a low voltage terminal of a coupling capacitor connected in parallel to the electrical apparatus.

These instruments make it possible to eliminate certain types of disturbances but have the disadvantage of not allowing detected signals to be processed for the purposes of extracting parameters other than the pulse amplitude and the pulse phase relative to the supply voltage. Also, this instrument necessarily has a very narrow bandwidth (a few hundred kHz) in the input stage. That means there is the risk of discharge pulses with a very high frequency content not being detected at all by the system.

Thus, the instrument is not very reliable for diagnostic purposes.

AIM OF THE INVENTION

This invention has for an aim to provide an instrument and a method for detecting partial electric discharges and which overcome the above mentioned disadvantages of the prior art.

In particular, the aim of this invention is to provide an instrument and a method for detecting partial electric discharges in a manner which is particularly complete and significant for diagnostic purposes and which at the same time complies with standards so that the measurement results can be compared.

Another aim of this invention is to provide an instrument and a method for detecting partial electric discharges which are particularly simple while guaranteeing high sensitivity, immunity to noise and, at the same time, maximum freedom of processing the data detected.

These aims are fully achieved by the instrument and method according to the invention as characterized in the appended claims.

More specifically, the instrument according to the invention comprises two different acquisition channels for the same discharge signal: the first being a broadband channel (hereinafter called HF channel), the second being a narrowband channel (hereinafter called LF channel), for example integrating a hardware analogue filter and/or a digital filter).

Further, according to the invention, the LF channel has an acquisition unit driven by a control signal generated by a trigger device operating on the HF channel.

In other words, the trigger of the LF channel is controlled in slave mode by the trigger of the HF channel.

The apparatus also comprises a time-delay unit connected in the LF channel, forming a compensation module configured to dynamically slow down the uninterrupted flow of digital signal samples in the LF channel, thus making available a compensated digital signal.

This makes it possible to match the pulses acquired by the two channels in a particularly effective manner.

According to another aspect of the invention, the instrument comprises a third acquisition channel, also narrowband, and hence a second LF acquisition channel. The second LF acquisition channel receives a signal picked up at the terminals of the indirect-measuring impedance device, while the first LF acquisition channel receives a signal picked up at the terminals of the direct-measuring impedance device, or vice versa.

All the acquisition channels digitize the respective signals in corresponding input stages.

Further, the instrument comprises a processor configured to receive the digitized signals of the two LF channels in such a way as to compare them and digitally processes them in order to cancel the common mode noise components of the two signals.

That makes it possible (using a particularly simple architecture) to detect partial electric discharges with high sensitivity and noise immunity and, at the same time, guarantees the maximum freedom of processing of the data detected since the acquisition channels are digital and work by sampling the full waveform of the pulses detected.

Similarly, the method according to the invention comprises detecting the same signal with two acquisition channels, one broadband HF channel and one narrowband LF channel.

Also, the method comprises controlling the acquisition unit of the LF channel with a control signal generated by a trigger acting on the HF channel. The method therefore comprises a crossed trigger step.

This guarantees detection even on the LF channel of any pulses corresponding to the partial discharges that would not be recognized if the trigger were on an LF channel; this therefore guarantees a high sensitivity.

At the same time, the fact of acquiring the signals in a narrow band, too, allows compliance with standards, to be able to compare the results of the measurements with any other result compliant with standards.

Further, the method according to the invention comprises also detecting a further signal (so as to detect, in all, signals both at the terminals of the direct-measuring impedance device and at the terminals of the indirect-measuring impedance device) and digitally comparing the signals (acquired in narrow band) in order to eliminate the components corresponding to common mode noise that may be present in the measuring circuit.

This enhances sensitivity and accuracy of measurement using a particularly simple architecture and without affecting the possibility of processing and analysing the data acquired.

BRIEF DESCRIPTION OF THE DRAWINGS

These and other features of the invention will become more apparent from the following description of a preferred, non-limiting embodiment of it, with reference to the accompanying drawings, in which.

DETAILED DESCRIPTION OF THE PREFERRED EMBODIMENTS OF THE INVENTION

The numeral 1 in the accompanying drawings denotes an instrument for detecting partial electric discharges in an electric apparatus.

Figure 1:
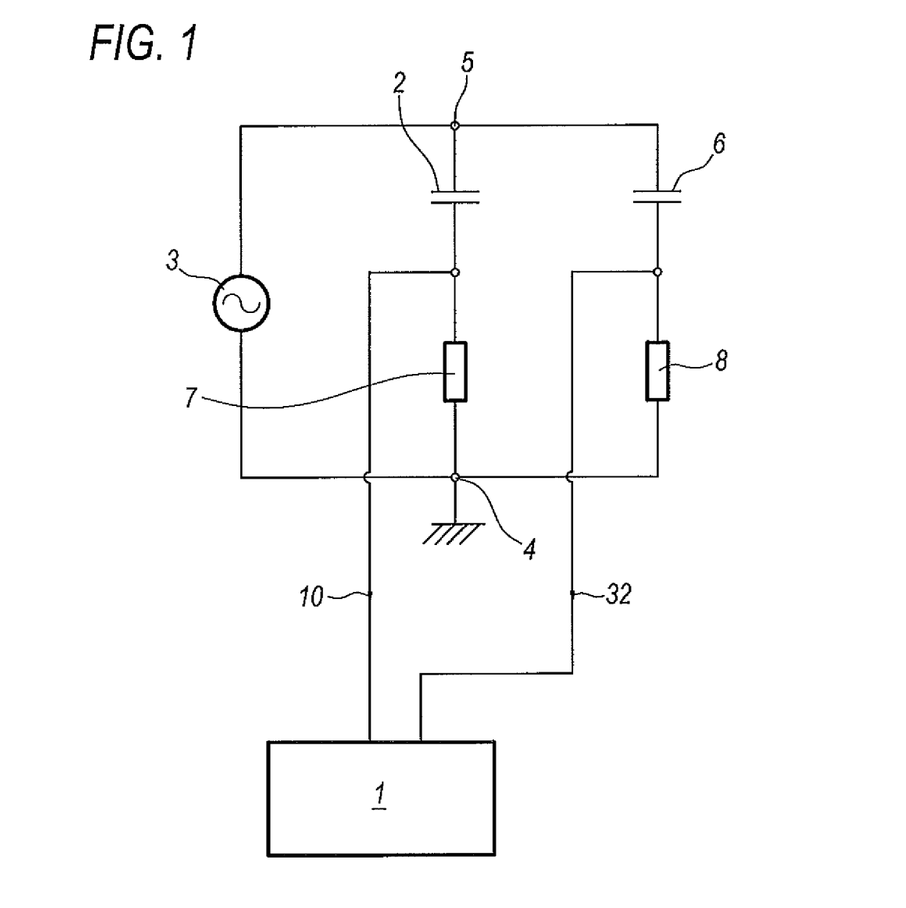
FIG. 1 schematically illustrates an instrument for detecting partial electrical discharges and connected to a circuit for detecting the partial discharges themselves.

The electric apparatus to be measured is schematically represented in FIG. 1 as a capacitor 2.

The electric apparatus 2 to be measured is connected across a power source 3, designed to apply high voltage to the electric apparatus 2, and an earth node 4.

Connected in parallel to the apparatus 2, across a high-voltage node 5 and the earth node, there is a capacitor 6 constituting a form of capacitance known as coupling capacitance.

The coupling capacitor 6, together with the measuring apparatus 2, forms a mesh for looping the partial discharge signals in order to form a partial discharge measuring circuit.

The measuring circuit also comprises a measuring impedance device 7 connected across a low-voltage terminal of the apparatus 2 and the earth node 4, this measuring impedance device 7 being hereinafter referred to as direct-measuring impedance device 7.

In addition to, or instead of, the direct-measuring impedance device 7, the measuring circuit also comprises a measuring impedance device 8 connected across the earth node 4 and a low-voltage terminal of the coupling capacitor 6; this measuring impedance device 8 is hereinafter referred to as indirect-measuring impedance device 8.

Figure 2:
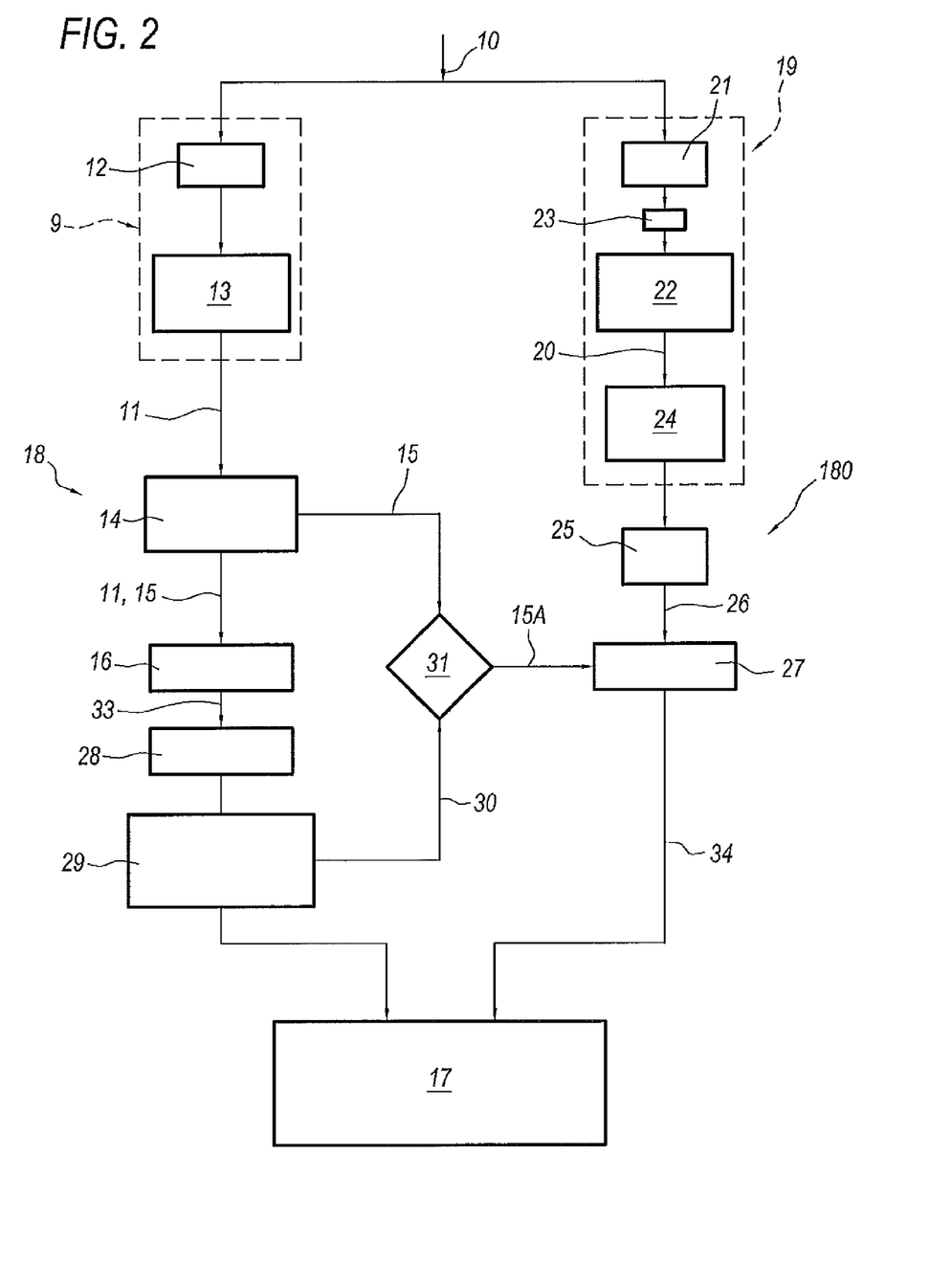
FIG. 2 is a functional diagram of the instrument according to the invention.

The instrument 1 comprises an input stage 9 designed to receive an analogue signal 10 representative of electrical pulses correlated with the partial discharges and to output a digital signal 11 forming an uninterrupted sample flow representative of the full waveform of the pulses. The input stage 9 forms a detection bandwidth of at least 10 MHz (preferably at least 20 MHz), and is hereinafter referred to as HF input stage 9, while the digital signal 11 is hereinafter referred to as HF digital signal 11.

The HF input stage 9 comprises:
a sensor 12 for detecting the analogue signal;
an A/D converter 13, that is, a sampler designed to convert the analogue signal 10 into the uninterrupted sample flow forming the HF digital signal 11.

Preferably, the sensor 12 is optimized for detecting signals in broadband. Preferably, the sensor 12 is configured to give a flat response in a frequency range from about 100-300 kHz to approximately 20 MHz. For example, an HFCT sensor or a measuring transformer might be used.

Preferably, the A/D converter 13 has a particularly high sampling frequency (for example, at least 100 MS/s).

The instrument 1 also comprises a trigger module 14.

The trigger module 14 is connected to the HF input stage 9 for receiving the HF digital signal. The trigger module 14 is also configured to generate a control signal 15 designed to allow selection of a plurality of samples of the flow according to a predetermined criterion (one of the several customary triggering methods).

The instrument 1 also comprises an HF acquisition unit 16.

The HF acquisition unit 16 is connected to the HF input stage 9 for receiving the HF digital signal 11. The HF acquisition unit 16 is also connected to the trigger module for receiving the control signal 15.

The HF acquisition unit 16 is configured to select from the sample flow (of the HF digital signal 11) groups of samples forming segments corresponding to individual electrical pulses as a function of the control signal 15.

The digital signal generated by the HF acquisition unit 16 (comprising the segments) is referred to as HF digital acquisition signal 33.

The instrument 1 comprises an output stage 17 designed to receive and process the data received from the HF acquisition unit.

Preferably, the output stage 17 is designed to derive (from the data derived from the HF acquisition unit) values of at least one predetermined parameter having, for example, the function of diagnostic indicator.

Further, the output stage 17 is preferably also configured to make the data received or derived accessible to the outside.

The HF output stage 9, the trigger module 14 and the HF acquisition unit 16 form a broadband acquisition channel 18 (hereinafter referred to as HF acquisition channel 18) of the instrument 1.

According to the invention, the instrument 1 also comprises an input stage 19 (hereinafter referred as LF input stage 19) forming a detection bandwidth of less than approximately 2 MHz (preferably less than 500 kHz).

It should be noted that, preferably, the bandwidth of the LF input stage 19 is such as to meet the requirements of regulations on the subject of partial discharge detection.

The LF input stage 19 is designed to receive the analogue signal 10 (the same signal received by the HF input stage 9) and to generate an LF digital output signal 20 forming an uninterrupted sample flow representative of the waveform of the pulses.

Preferably, the LF input stage 19 comprises:
a sensor 21 for detecting the analogue signal (in narrow band);
an A/D converter 22, that is, a sampler designed to convert the analogue signal 10 into the uninterrupted sample flow forming the LF digital signal 21.

Preferably, the sensor 21 is optimized for detecting signals in narrowband.

For example, the sensor 21 is configured to give a flat response in a frequency range from about 100 kHz to approximately 2 MHz, offering a particularly high gain in that frequency interval.

Preferably, the A/D converter 22 has a lower sampling frequency than the A/D converter 13 (for example, 5-20 Ms/s instead of 100 MS/s and over) but is configured to maximize sampling precision. More specifically, configurations that use low-noise, high-resolution A/D converters are preferable.

Figure 3:
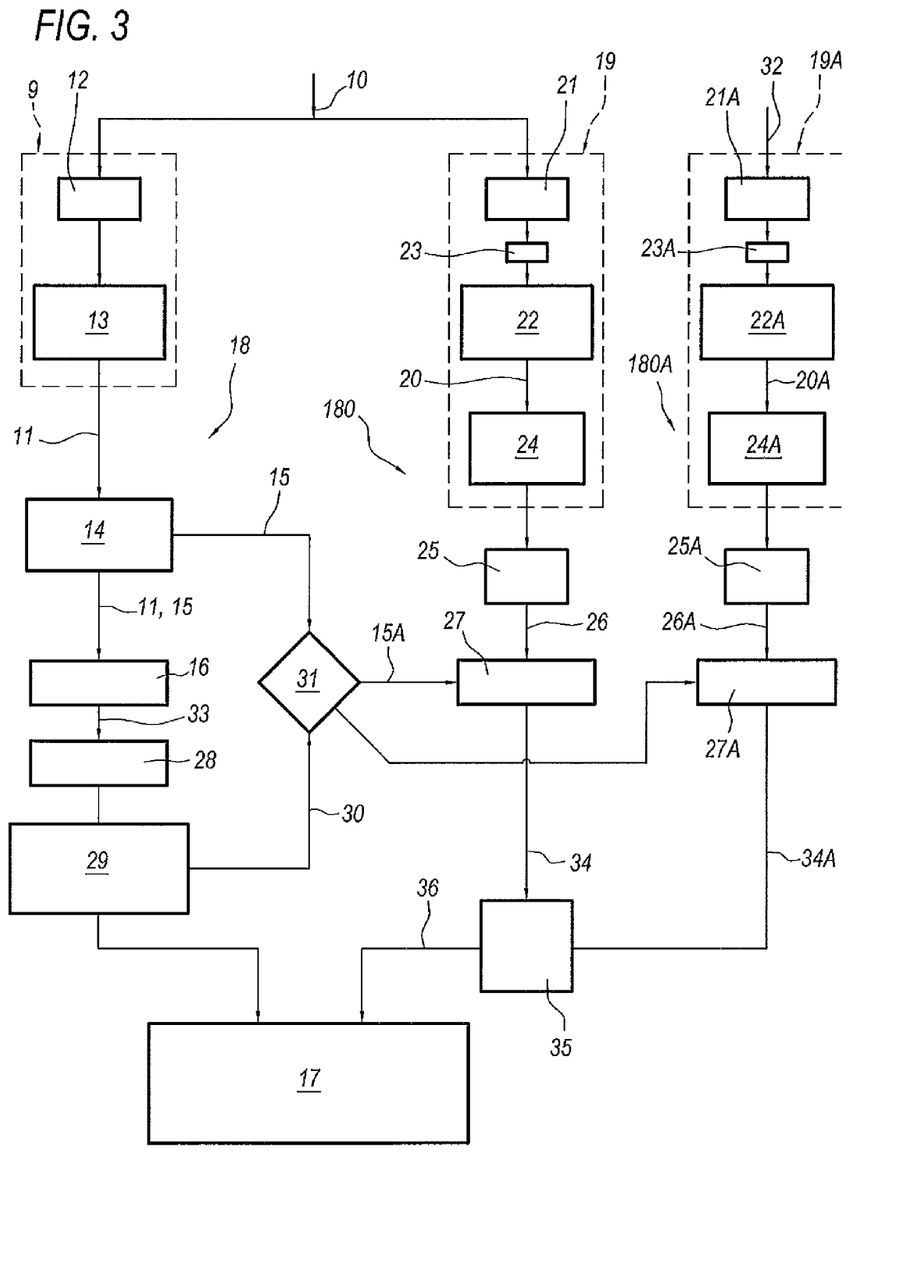
FIG. 3 is a functional diagram of the instrument of FIG. 1 according to another embodiment.

It should be noted, however, that the instrument 1 might also comprise a single sensor 12, shared by the HF acquisition channel and an LF acquisition channel 180 (which mirrors the LF acquisition channel, as illustrated in FIGS. 2 and 3).

The invention also contemplates use of a single A/D converter 13, shared by the HF acquisition channel and an LF acquisition channel.

In that case, the sensor and the A/D converter must be configured to form a broadband.

It should be noted that the instrument 1 preferably also comprises one or more passband filters connected in the LF acquisition channel in order to reduce the bandwidth.

For example, the instrument 1 preferably comprises an analogue passband filter 23 connected upstream of the LF A/D converter 22.

Alternatively to, or more preferably, in combination with, the analogue passband filter 23, the instrument 1 preferably comprises a digital passband filter 24 connected downstream of the LF A/D converter 22.

The analogue filter 23 has the advantage of allowing use of an LF A/D converter 22 which is optimized for the narrow bandwidth.

The digital filter 24 has the advantage of allowing the bandwidth of the LF input stage 19 to be adjusted to adapt to different standards and/or to optimize the configuration of the instrument to a specific electrical apparatus 2 or to a specific measuring circuit.

For example, the invention might contemplate the use of a plurality (for example, four) filters in cascade of the type known as "Moving average filters", configured in such a way as to allow derivation of moving averages applied to a fixed time interval.

Thus, the LF input stage 19 comprises the digital filter 24, which has a passband lower than 500 kHz.

Further, the instrument 1 comprises, according to the invention, a compensation module 25 coupled to the LF input stage 19 to dynamically slow down the uninterrupted flow of LF digital signal 20 samples, thereby making available a compensated LF digital signal 26.

A compensation module might, for example, consist of a digital buffer used as a time-delay compensation line which can be varied dynamically from one acquisition to another. In practice, this stage is configured in such a way as to allow temporal realignment of the signals acquired in the LF and HF channels at different frequencies and with different durations and which change from one acquisition to the next.

It should be noted that the compensation module 25 may be connected upstream or downstream of the digital filter 24 but must necessarily be downstream of the LF A/D converter 22 since it operates on a digital signal.

The instrument 1 further comprises an LF acquisition unit 27 designed to receive the compensated LF digital signal 26.

The LF acquisition unit 27 is connected to the trigger module 14 for receiving the control signal 15.

The LF acquisition unit 27 is configured to select from the compensated LF digital signal segments corresponding to the segments selected by the HF acquisition unit 16, that is to say, relating to the same corresponding electrical pulses.

The output stage 17 is designed to receive the data received from the LF acquisition unit 27 that is to say, the segments relating to the discharge pulses).

Preferably, the output stage 17 is designed to process the data received from the LF acquisition unit 27 in order to derive, for each pulse, an amplitude parameter value relating to the amplitude of that pulse, correlated with a corresponding predetermined value of that parameter (calculated on the basis of the data received from the HF acquisition unit 16).

That way, the invention makes it possible to assign to each discharge pulse acquired an amplitude value (in terms of apparent charge assigned to the corresponding partial discharge) according to standards (thanks to the LF acquisition channel) and values of one or more parameters relating to the full waveform calculated as a function of the signal acquired in broadband.

Further, the probability of a discharge pulse eluding acquisition in narrowband is minimized by the fact that the LF acquisition channel has a trigger controlled in slave mode by the trigger of the HF (that is, broadband) acquisition channel.

Preferably, the instrument 1 also comprises a processing unit 28 connected downstream of the HF acquisition unit 16 (and hence in the HF acquisition channel) for extracting substantially in real time the values of one or more predetermined parameters relating to the pulses acquired.

The instrument 1 further comprises a filtering module 29 connected downstream of the processing module 28 for comparing the derived values with preset reference values and deriving a filtering signal 30 designed to disable substantially in real time the transfer to the output stage 17 of the data relating to one or more pulses, as a function of the comparison.

According to the invention, the LF acquisition unit 27 is also connected to the filtering module 29 for receiving the filtering signal 30.

That way, the real time filtering effect (as a function of the predetermined parameter values calculated in real time on the HF acquisition channel) is reflected also on the LF acquisition channel.

That makes the instrument 1 particularly efficient, avoiding the waste of time and resources on signals which are irrelevant according to predetermined, user set parameters.

It should be noted that, preferably, the compensation module 25 is connected to the processing module 28 in order to dynamically delay the uninterrupted flow of LF digital signal samples as a function of an estimated calculation time for the processes in progress in the processing module. The processing module provides an accurate estimation of the time required by the compensation module to realign the two signals of the LF and HF channels.

Thus, the LF acquisition unit 27 is designed to receive a drive signal 15A conditioned as a function of the filtering signal 30 (for example, through a conditioning block 31 implemented through a control logic of per se known type, programmable by the user).

The digital signal generated by the LF acquisition unit 27 (comprising the segments) is referred to as LF digital acquisition signal 34.

Below is a more detailed description of the processing module 28 and of the filtering module 29.

It should be noted that during measurement of the partial discharges, it is assumed that the apparatus 2 (that is, the insulating system of the apparatus) is subjected to alternating current voltage (50 Hz in the example illustrated).

The fact that the electrical apparatus is subjected to alternating current voltage (typically sinusoidal) makes it possible to assign to each signal detected the value of a phase parameter given by the phase of the voltage applied to the apparatus at the instant the signal is detected and hence representative of the value of the voltage applied to the apparatus at the instant the signal is detected.

In light of this, the output stage 9 is designed to also receive a sync signal (according to a method of per se known type) representative of the alternating voltage applied to the electrical apparatus 2.

For example, the sync signal is picked up by a capacitive divider or other known system.

The processing unit 28 is designed to also receive the sync signal.

The processing module 28 is configured to extract (substantially in real time) for each pulse detected, the values at least of the following parameters:
an amplitude parameter q, correlated with an amplitude of the pulse;
a phase parameter f, representative of the phase of the voltage applied to the apparatus 1 concurrently with the pulse.

The amplitude of the pulse is correlated, for example, with the peak intensity of the pulse or with the effective value of the same, and is normally measured in V or pC.

The pulse phase is measured in degrees and varies between 0 and 360.

Preferably, the processing module 28 is designed to extract other parameters, in addition to the amplitude parameter q and the phase parameter f.

More specifically, the processing module 28 is designed to receive the digitized discharge signal containing the segments selected by the HF acquisition unit 16 and, for each pulse detected, to extract substantially in real time the value of at least one shape parameter correlated with the waveform of the pulse.

More preferably, the processing module 28 is designed to extract (substantially in real time), for each detected pulse of the digital discharge signal, the value of a first shape parameter W, correlated with the frequency content of the pulse, and of a second shape parameter T, correlated with the duration of the pulse.

It should be noted that, for deriving the above mentioned shape parameters, the processing module 28 is preferably programmed to operate as follows:
the first shape parameter W is derived as standard deviation of the partial discharge pulse processed in the frequency domain;
the second shape parameter T is derived as standard deviation of the partial discharge pulse processed in the time domain.

Preferably, the processing module 28 is designed to also extract the following parameters:
detection instants (for each pulse detected), referenced both to an absolute reference (for example a GPS synchronization system) and to a reference instant for the start of an acquisition (by acquisition is meant detection of a plurality of pulses protracted for a predetermined time, or detection of a predetermined number of pulses);
repetition rate of the pulses detected per unit of time.

Thus, the processed digital signal generated by the processing module 28 preferably comprises the values extracted for these parameters.

The extraction of the parameters occurs substantially in real time, that is to say, without the need for an intermediate data storage memory.

More specifically, as regards the expressions "in real time" and "storage memory" attention is drawn to the following.

The expression "processing of a data item in real time" is used to mean that, within a data flow (for example from an input to an output), that data item is processed substantially without the process involving an interruption in the data flow. For example, the fact of placing the data item in a memory (potentially for an indefinite length of time) for subsequent retrieval and processing at any later time constitutes an interruption in the data flow and, hence, data storage. By "storage memory" is precisely meant a memory designed to (that is to say, a memory controlled, in terms of hardware, in such a way as to) contain a data item for a potentially indefinite time for subsequent retrieval (at any time) and processing. In light of this, it should be noted that a mass storage memory, such as the hard disk of a computer, for example, is typically a storage memory, while a RAM may, depending on how it is controlled, constitute a storage memory (as defined above) or, alternatively, a buffer (temporary memory), that is, a means of slowing down the data flow (at a certain point along the path followed by the data from input to output) but without interrupting it. Thus, by "processing in real time" is meant that processing occurs during the passage of the data from an input to an output in a substantially continuous flow, where the data flow can be slowed down by temporarily accumulating the data in a substantially volatile memory.

Preferably, the filtering module 29 is designed to disable, substantially in real time, the transfer to output (that is, to the output stage 17) of the data relating to (that is of the parameter values extracted for) one or more pulses, as a function of comparing the extracted values for the amplitude parameter q and the phase parameter f with predetermined reference values for said amplitude and phase parameters.

Preferably, the filtering module 29 is designed to disable substantially in real time the transfer to output of the values of the parameters extracted for all the pulses whose extracted amplitude and phase parameter values lie in a reference plane (q-f) having as its coordinates the phase and amplitude parameters inside or outside a filtering area defined by the reference values of the phase and amplitude parameters.

It should be noted that the expression "inside or outside a filtering area" is used to mean inside or, alternatively, outside that filtering area.

That way, the processed digital signal made available at the output of the processing module 28 is free of data corresponding to the unwanted pulses, as a function of a filtering criterion based on the comparison between the values of certain parameters (in particular, amplitude q and phase f) for those pulses and the reference values of the parameters themselves.

It should be noted that the filtering module 29 comprises a chip which can be configured to define a filtering logic.

The filtering module 29 is also equipped with interfacing means (not illustrated, being of per se known type) through which the user of the instrument 1 can set or modify the control logic and/or the reference values of the parameters used for filtering.

For example, the filtering module 29 comprises an FPGA (Field Programmable Gate Array) and a DSP connected to each other.

The FPGA constitutes a memory containing the data relating to the filtering parameter reference values and the type of filtering logic. Further, the FPGA receives as input the digital signal containing the filtering parameter values and outputs the filtered signal, that is, the signal without the data relating the pulses whose filtering parameter values do not satisfy the filtering criteria.

The DSP constitutes the interfacing means.

It should be noted that the filtering module 29 might also be made according to alternative embodiments. For example, an FPGA that also integrates the functions of the DSP might be used (in that case the DSP is not present). Alternatively to the FPGA, a dedicated chip, such as, for example, an ASIC (Application Specific Integrated Circuit), might be used.

More specifically, the reference values for the amplitude and phase parameters define at least one filtering area in the reference plane q-f having as its coordinates the phase and amplitude parameters.

In light of this, the filtering logic establishes whether disabling (that is, inhibition) of transfer to output of the extracted parameter values occurs for the pulses whose extracted amplitude and phase parameter values lie inside or outside the filtering area of the representation plane q-f.

In other words, depending on the filtering logic, the instrument 1 makes it possible to acquire (and hence make available at output) only the pulses which, in the representation plane q-f, lie inside or, alternatively, outside the filtering area defined by the predetermined reference values of the amplitude q and phase f parameters.

It should be noted that the processing module 28 is designed to extract the parameters used for filtering; any other parameters (not used in the filtering module 29) are extracted preferably in the output stage 17 to avoid unnecessarily slowing down the data flow in the HF acquisition channel.

This advantageously also makes it possible to perform highly complex calculations (for extracting the parameters that require such calculations) only on significant pulses, so as to avoid wasting resources and hence time processing data that will inevitably be overwritten, that is to say, whose transfer to output will inevitably be disabled (that is, inhibited).

It should also be noted that, in some cases, the output stage 17 might not perform any calculation where all the significant parameters are extracted in the processing module 28, that is, upstream of the filtering module 29.

As regards the method of defining the filtering area from the reference values of the filtering parameters, attention is drawn to the following.

The instrument 1 comprises at least one pair of reference values for the phase parameter and at least one pair of reference values for the amplitude parameter, defining at least one corresponding rectangular filtering area in the reference plane q-f having as its coordinates the phase and amplitude parameters. In practice, two pairs of reference values of the parameters q and f constitute two pairs of coordinates, for identifying two points in the reference plane q-f. These points define one of the diagonals of the rectangle.

The filtering module 29 is designed to disable substantially in real time the transfer to output of the data relating to (that is, the values of the parameters extracted for) all the pulses whose extracted amplitude and phase parameter values lie in the representation plane q-f inside (or outside) the filtering area.

According to the invention, the filtering module 8 may be provided with a plurality of reference values for the amplitude parameter q and a corresponding plurality of reference values for the phase parameter f, thus defining a plurality of filtering areas.

In that case, the filtering module 29 is configured to define a resultant filtering area that is the union of those filtering areas.

Operatively, the filtering module 29 is designed to disable substantially in real time the transfer to output of the data relating to (that is, the values of the parameters extracted for) all the pulses whose extracted amplitude and phase parameter values lie in the representation plane, inside, or alternatively, outside, all of those filtering areas.

According to another aspect of the invention, preferably, the filtering module 29 is designed to disable, substantially in real time, the transfer to output of the data relating to (that is of the parameter values extracted for) one or more pulses, as a function of comparing the extracted values for the shape parameter (or rather, at least one of the possible shape parameters correlated with the waveform of the pulses detected) with predetermined reference values for said shape parameter.

Preferably, the filtering module 29 is designed to disable substantially in real time the transfer to output of the data relating to (that is of the parameter values extracted for) all the pulses whose extracted values of the first and second shape parameters (W and T) lie in a reference plane W-T having as its coordinates said first and second shape parameters inside (or, alternatively, outside) a filtering area defined by predetermined reference values of the first and second shape parameters.

The above description regarding the preferred method of defining the filtering area through rectangles or a union of rectangles also applies to filtering as a function of the values of the shape parameters W and T.

Thus, the instrument 1 is designed to define two (or more) independent filtering criteria.

In the example described above, the first filtering criterion is based on the values of the parameters of amplitude q and phase f, and the second filtering criterion is based on the values of the first shape parameter W and of the second shape parameter T.

The reference values of each pair of filtering parameters define corresponding filtering areas in the respective reference planes (more specifically, a first filtering area in the plane q-f and a second filtering area in the plane W-T).

In light of this, it should be noted that the filtering logic defined by the filtering module 29 (and settable by the user of the instrument 1 through the interfacing means) can be configured in such a way that transmission of the data corresponding to a pulse is disabled when both the filtering criteria are met simultaneously or, alternatively, when at least one of the filtering criteria is met.

In light of this, it should be noted that the filtering module 29 is designed to disable substantially in real time the transfer to output of the data relating to (that is, the values of the parameters extracted for) all the pulses whose extracted amplitude and phase parameter values lie in the reference plane q-f inside (or outside) the corresponding filtering area (defined by the reference values of the phase and amplitude parameters) and/or whose extracted values of the first and second shape parameters lie in a reference plane W-T inside (or outside) the corresponding filtering area (defined by the reference values of the first and second shape parameters).

The combination of a filtering criterion based on the amplitude and phase parameters and a filtering criterion based on the shape parameters is particularly effective because it synergically combines the effects of both filtering criteria.

In effect, the filtering criterion based on the amplitude and phase parameters is very important because the pulses relating to a partial discharge activity tend to be positioned in certain zones of the reference plane q-f. Similarly, the pulses due to certain disturbances (for example, the disturbances correlated with the voltage applied to the apparatus being measured) are positioned in zones of the plane q-f different from those of the pulses relating to the partial discharges and thus able to be recognized and isolated. It is therefore important to be able to exclude certain zones of the plane q-f from acquisition.

The filtering criterion based on the shape parameters is also useful because it has been found that pulses relating to different sources tend to have different waveforms and hence to be positioned in separate zones of the reference plane W-T. Therefore, pulses due to certain disturbances (for example, background noise) are positioned in zones of the plane W-T different from those of the partial discharge pulses and can thus be recognized and isolated. It should be noted, on the other hand, that at times these unwanted pulses (for example, due to background noise not correlated with the voltage applied to the apparatus being measured) are laid (at least partly) over the pulses corresponding, in the plane q-f, to the partial discharges and are thus difficult to isolate in the plane q-f.

In short, as regards groups of pulses corresponding to concurrent phenomena (hence detected during the same acquisition having predetermined duration) that must be distinguished (in order to inhibit acquisition of one or more of these phenomena), certain groups may, depending on circumstances, be distinguishable in relation to certain parameters or combinations of parameters rather than others.

It should be noted that, instead of rectangles, the areas might be defined in other ways—for example, the areas might be circular or ellipsoidal or based on any other suitable criterion.

According to another aspect of the invention, combinations of more than two parameters might be used.

In other words, hyperspaces might be defined which have any predetermined number of dimensions, equal to the number of filtering parameters to be used in combinations.

For example, a filtering criterion to be set might be based on a combination of the amplitude parameter q, the phase parameter f and one (or both) of the shape parameters W and T.

According to another aspect of the invention, combinations of pairs of parameters other than those described above might be used—for example the following combinations:
amplitude parameter q—first shape parameter W;
amplitude parameter q—second shape parameter T;
phase parameter f—first shape parameter W;
phase parameter f—second shape parameter T;

Preferably, therefore, the filtering module 29 is designed to disable substantially in real time the transfer to output of the data relating to (that is of the parameter values extracted for) all the pulses whose extracted values of the shape parameter and of the amplitude parameter or of the phase parameter lie in a reference plane having as its coordinates the shape parameter and the amplitude or phase parameter inside a filtering area defined by predetermined reference values of the shape parameter and of the amplitude or phase parameter.

It should be noted that the instrument 1 also preferably comprises a display not illustrated, being of per se known type, as for example, a screen) connected to the processing module 28 that is, to the output stage 17) for displaying (for example) the parameters extracted in the processing module 28.

The display is designed to display a representation of the pulses selected by the HF acquisition unit 16 and/or by the filtering module 29 in a representation plane having as its coordinates the amplitude and phase parameters.

More specifically, the display is configured to represent the pulses as points in the reference plane q-f.

In addition, the display is designed to display a representation of the pulses in a representation plane T-W having as its coordinates the first and second shape parameters.

More specifically, the display is configured to represent the pulses as points in the reference plane W-T.

Further, the display is configured to represent the pulses in any representation plane, defined by two or three parameters selectable by the user of the instrument 1.

In light of this, it should noted that the display is connected to the interfacing means to allow the user of the instrument 1 to select at his/her discretion the parameters for displaying the pulses and to set corresponding reference values and filtering logics related to those parameters.

Further, the interfacing means are configured to constitute a selector connected to the display to allow the user of the instrument 1 to select (that is, to define) at least one region of the representation plane (or rather, of at least one of the representation planes or spaces), so as to transfer to the processing unit corresponding values of the filtering parameters describing the selected space region. These values constitute the reference values for the filtering module 29 and the selected space region constitutes the filtering area.

This advantageously allows the user of the instrument 1 to display the discharge patterns (for example the PRPD pattern in the plane q-f or the pattern in the plane T-W) and to very easily select the filtering areas (for example by drawing rectangles with a mouse) and set the filtering criteria.

That way, the effects of filtering are displayed in real time on all the representations (in the example described, on the representation in the plane q-f and in the plane W-T).

Advantageously, that means the effects of filtering can be viewed in real time and the set filtering criteria improved or removed.

Attention is drawn to the following according to another aspect of the invention.

The electrical apparatus 2 being measured is connected up in a measuring circuit including both the direct-measuring impedance device 7 and the indirect-measuring impedance device 8.

The instrument 1 comprises two LF acquisition channels 180: a first LF acquisition channel 180 and a second LF acquisition channel 180A.

In accordance to what is described above, the first LF acquisition channel 180 comprises: the (first) LF sensor 21, the (first) LF A/D converter 22, the (first) analogue passband filter 23, the (first) digital filter 24, the (first) compensation module 25 and the (first) LF acquisition unit 27.

Similarly, the second LF acquisition channel 180A (like the first LF acquisition channel 180 and hence, in accordance to what is described above) comprises: a (second) LF sensor 21A, a (second) LF A/D converter 22A, a (second) analogue passband filter 23A, a (second) digital filter 24A, a (second) compensation module 25A and a (second) LF acquisition unit 27A.

Thus, the second LF input stage 21A is designed to:
receive an analogue signal 32 picked up at the terminals of the indirect-measuring impedance device 8 and representative of electrical pulses correlated with the partial discharges; and to
generate a second LF digital output signal 20A forming an uninterrupted sample flow representative of the pulses.

Preferably, the second LF input stage 19A forms a detection bandwidth equal to that of the first LF input stage 19. Said bandwidth is preferably less 2 MHz and, more preferably, is less than 500 kHz.

Thus, the second compensation module 25A is coupled to the second LF input stage 19A to dynamically slow down the uninterrupted flow of second LF digital signal 20A samples, thereby making available a second compensated LF digital signal 26A.

The second LF acquisition unit 27A is designed to receive the second compensated LF digital signal 26A LF and the signal 15 (or 15A, if the filtering module 29 is present). It is also configured to select from the flow of second compensated LF digital signal 26A samples groups of samples forming segments corresponding to individual electrical pulses and thus generating a second LF digital acquisition signal 34A.

According to this aspect of the invention, the instrument 1 also comprises a processing block 35 designed to receive the first and the second LF digital acquisition signal 34 and 34A in order to generate a balanced digital signal 36.

The balanced digital signal 36 has no components representative of common mode electrical signals present in the measuring circuit.

The output stage 17 is designed to receive and process the balanced digital signal 36.

It should be noted that this aspect of the invention (two parallel LF acquisition channels receiving signals from the direct- and indirect-measuring impedance devices respectively, and connected to the processing block 35 to derive the balanced digital signal 36) does not necessarily imply the presence of the HF acquisition channel 18.

It should be noted, however, that the presence of three acquisition channels (one HF and two LF in a bridge-like configuration, as in the example shown in FIG. 3) has considerable advantages. Indeed, the effects connected with the simultaneous presence of HF and LF channels (for example, the advantage of having a trigger on the broadband channel to also control acquisition of narrowband channels, and the advantages associated with the possibility of filtering in real time the pulses detected as a function of predetermined parameters extracted from the signal of the HF channel) are synergically combined with the effects connected with the presence of two LF channels in a digital bridge configuration (for example the advantage of eliminating noise components in a simple, rapid and effective way), thus producing an instrument which is highly sensitive and constructionally simple.

Where the HF acquisition channel is absent, the instrument 1 nevertheless comprises a trigger module 14 but the latter, in such case, is connected up in one of the two LF acquisition channels. The other LF acquisition channel still has the trigger controlled in slave mode to the trigger module 14 connected up in the other channel.

The processing block 35 has access to a memory containing a transformation function T such that the first LF digital acquisition signal coincides (except for the sign) with the second LF digital acquisition signal transformed by the transformation function, in the absence of the signals produced by components generated by common mode electric signals present in the measuring circuit.

In light of this, the balanced digital signal 36 is the difference between the first LF digital acquisition signal 34 and the second LF digital acquisition signal 34A transformed by the transformation function, or vice versa.

It should be noted that the processing block 35 is preferably configured to process the first and the second digital acquisition signal 34 and 34A in the frequency domain or, alternatively, in the time domain.

Where the processing block 35 works in the frequency domain, the transformation function is of the following type.

$$T = A \cdot \exp(i\omega_0) \quad (1)$$

In the above expression A is a constant (correlated with the amplitude of the pulses) and $\omega_0$ is a phase value (so as to express a phase shift).

Where the processing block 35 works in the time domain, the transformation function is of the following type.

$$T = A \cdot R(t_0) \quad (2)$$

In the above expression A is a constant (correlated with the amplitude of the pulses), R is a time translation operator (of substantially known type) and, $t_0$ is a time (correlated with a pulse time shift).

The processing block 35 is also configured to process the (first and second) digital acquisition signals 34 and 34A through windowing of the signal, that is, by performing a particularly fine selection (using mathematical algorithms of per se known type in signal processing) of a group of samples (of a predetermined segment) corresponding to a pulse.

Preferably, the processing block 35 is configured to perform the windowing before the signal is, if necessary, transformed in the frequency domain (Fourier transform).

Hence, this invention (according to this further aspect of it also provides an instrument 1 for detecting partial electrical discharges which occur in an electrical apparatus 2 connected up in a measuring circuit having the direct-measuring impedance device 7 and the indirect-measuring impedance device 8 described above.

Said instrument comprises, in combination:
a first LF input stage 19 designed
to receive an analogue signal 10 picked up at the terminals of the direct-measuring impedance device and representative of electrical pulses correlated with the partial discharges;
and to generate a first LF digital output signal 20 forming an uninterrupted sample flow representative of the pulses, the first LF input stage 19 forming a detection bandwidth of less than 2 MHz (preferably less than 500 kHz);

a first LF acquisition unit 27 connected to the first LF input stage 19—in order to receive the first LF digital signal 20—and to a trigger module (for example coupled to the first LF acquisition channel 180 or to an HF acquisition channel 18, if any)—in order to receive a control signal 15 designed to allow samples of said flow to be selected according to a predetermined criterion, and configured to select from the flow of samples groups of samples forming segments corresponding to individual electrical pulses as a function of the control signal 15, thus generating a first LF digital acquisition signal 34;

a second LF input stage 19A designed to receive an analogue signal 32 picked up at the terminals of the indirect-measuring impedance device 8 and representative of electrical pulses correlated with the partial discharges, and to generate a second LF digital output signal 20A forming an uninterrupted sample flow representative of the pulses, the second LF input stage 19A forming a detection bandwidth of less than 2 MHz (preferably less than 500 kHz);

a second LF acquisition unit 27A connected to the second LF input stage 19A—in order to receive the second LF digital signal 20A—and configured to receive the control signal 15 designed to allow samples of said flow to be selected according to a predetermined criterion, and configured to select from the flow of samples groups of samples forming segments corresponding to individual electrical pulses as a function of the control signal 15, thus generating a second LF digital acquisition signal 34A;

a processing block 35 designed to receive the first and second LF digital acquisition signals 34 and 34A to generate a balanced digital signal 36 without components representative of common mode electrical signals present in the measuring circuit;

an output stage 17 designed to receive and process the balanced digital signal 36.

This invention also provides a method for detecting partial electric discharges in an electrical apparatus 2.

The method comprises the following steps:

receiving, in the HF input stage 9 forming a bandwidth of at least 20 MHz, the analogue signal 10 representative of electrical pulses correlated with the partial discharges and outputting the HF digital signal 11 forming an uninterrupted sample flow representative of the full waveform of the pulses (the analogue signal 10 being picked up without distinction from the direct-measuring impedance device 7 or from the indirect-measuring impedance device 8);

generating a control signal 15 designed to allow selection of a plurality of samples of the flow according to a predetermined criterion through a trigger module 14 that receives the HF digital signal 11;

selecting, from the flow of samples, groups of samples forming segments corresponding to individual electrical pulses as a function of the control signal 15, through the HF acquisition unit 16 that receives the HF digital signal 11 and the control signal 15; thus, the HF acquisition unit 16 outputs the HF digital acquisition signal 33;

processing the segments selected by the HF acquisition unit 16 (that is, processing the HF digital acquisition signal 33) in order to derive, for each pulse, at least one predetermined parameter relating to the waveform of the pulses.

This processing step may be performed in the processing module 28 (if present), in real time, and/or in the output stage 17.

These parameters are particularly significant for diagnostic purposes since they take into account the full waveform of the pulses detected in broadband.

According to the invention, the method further comprises the following steps:

receiving, in the LF input stage 19 (forming a bandwidth of less than 2 MHz, and preferably less than 500 kHz), the analogue signal 10 and outputting the LF digital signal 20 forming an uninterrupted sample flow representative of the waveform of the pulses;

dynamically slowing down the uninterrupted flow of LF digital signal 20 samples to compensate for delays relative to the corresponding samples of the HF digital signal, in order to generate the compensated LF digital signal 26 the delays are due to the different bandwidths of the two acquisition channels 18 and 180, and to the action, if any, of the filtering module 29);

selecting from the compensated LF digital signal 26 segments corresponding to the segments selected by the HF acquisition unit (forming the LF digital acquisition signal 34), that is, relating to the same corresponding electrical pulses, through the LF acquisition unit 27 that receives the compensated LF digital signal 26 and the control signal 15 (or 15A);

processing the segments selected by the LF acquisition unit 27 (that is, processing the LF digital acquisition signal 34) in order to derive, for each pulse, the value of an amplitude parameter corresponding to the amplitude of that pulse, correlated with a corresponding value of the at least one predetermined parameter.

Advantageously, this amplitude value meets the criteria required by standards.

Preferably, processing of the segments selected by the HF acquisition unit 16 occurs substantially in real time (in the processing module 28) and is followed by a step of comparing in real time the derived values with preset reference values, in order to derive a filtering signal 30 for disabling substantially in real time the transfer to output of the data relating to one or more pulses, as a function of the comparison.

The method of performing this comparing step, that is, for filtering on the basis of the parameters calculated in real time, is the one described above in connection with the instrument 1.

According to the invention, selection of the segments from the LF compensated digital signal 26 is performed also as a function of the filtering signal 30.

More specifically, the step of dynamically slowing down the uninterrupted flow of LF digital signal 20 samples is performed as a function of an estimated calculation time for the step of processing substantially in real time the segments selected by the HF acquisition unit, through a dedicated control logic.

According to another aspect of the method of this invention, the step of receiving in the LF narrowband acquisition channel comprises:

a first step of receiving a first analogue signal 10 picked up at the terminals of the direct-measuring impedance device 7;

a second step of receiving a second analogue signal 32 picked up at the terminals of the indirect-measuring impedance device 8, or vice versa.

Thus, the method entails generating a first and a second LF digital output signal 20 and 20A forming an uninterrupted sample flow representative of the pulses.

Both the first and the second LF digital signals 20 and 20A are subjected to the slowing down and selecting steps (described above) to generate a first and a second LF digital acquisition signal 34 and 34A, The processing step comprises comparing the first and second LF digital acquisition signals 34 and 34A to generate a balanced digital signal 36 without components representative of common mode electrical signals present in the measuring circuit, and then processing said balanced digital signal 36.

Preferably, the method comprises a step of providing a transformation function T such that the first LF digital acquisition signal 34 coincides with the second LF digital acquisition signal 34A transformed by the transformation function, in the absence of the signals produced by components generated by common mode electric signals present in the measuring circuit.

The processing of the first and second LF digital acquisition signals 34 and 34A involves subtracting the second LF digital acquisition signal, transformed by the transformation function, from the first LF digital acquisition signal, or vice versa, in order to derive the balanced digital signal.

Preferably, the transformation function is of the type indicated above by the expression (1) or, alternatively, by the expression (2).

Preferably, the step of providing the transformation function comprises the following steps:
connecting a calibrator (of per se known type in the field of partial discharge measurement) across the high-voltage terminal 5 of the electrical apparatus 2 and the earth node 4 in order to inject into the measuring circuit a calibration current signal;
generating a first and a second LF calibrating acquisition signal by applying the receiving and selecting steps to the calibrating signal;
deriving the transformation function according to the LF digital calibrating acquisition signals.

That guarantees that the signals used to derive the transformation function consist entirely of common mode components.

It should be noted that, according to this aspect of the invention, the step of acquiring in broadband (in the HF channel) is not essential but is preferable (for the reasons set out above).

Hence, the invention also provides a method for detecting partial electrical discharges in an electrical apparatus included in a measuring circuit having a direct-measuring impedance device connected across a low-voltage terminal of the electrical apparatus and an earth node, and an indirect-measuring impedance device connected across the earth node and a low voltage terminal of a coupling capacitor connected in parallel to the electrical apparatus.

The method comprises the following steps:
receiving, in a first LF input stage 19, a first analogue signal 10 picked up at the terminals of the direct-measuring impedance device 7 and representative of electrical pulses correlated with the partial discharges and outputting a first LF digital signal 20 forming an uninterrupted sample flow representative of the full waveform of said pulses, the first LF input stage forming a bandwidth of less than 2 MHz (preferably less than 500 kHz);
selecting from the first LF digital signal 20 through a first LF acquisition unit 27 that receives the first LF digital signal 20 and a control signal 15 designed to allow selection of samples of said flow and of groups of samples forming segments corresponding to individual electrical pulses as a function of the control signal, thus generating a first LF digital acquisition signal 34;
receiving, in a second LF input stage 19A, a second analogue signal 32 picked up at the terminals of the indirect-measuring impedance device 8 and representative of electrical pulses correlated with the partial discharges and outputting a second LF digital signal 20A forming an uninterrupted sample flow representative of the pulses, the second LF input stage 19A forming a bandwidth of less than 2 MHz (preferably less than 500 kHz);
selecting, from the second LF digital signal 20A through a second LF acquisition unit that receives the second LF digital signal 20A and the control signal 15, groups of samples forming segments corresponding to individual electrical pulses as a function of the control signal 15, thus generating a second LF digital acquisition signal 34A;
comparing the first and second LF digital acquisition signals 34 and 34A to generate a balanced digital signal 36 without components representative of common mode electrical signals present in the measuring circuit, so as to allow processing of said LF balanced digital signal 36.

The invention claimed is:

1. An instrument (1) for detecting partial electric discharges in an electric apparatus (2), when said apparatus (2) is connected to a measuring circuit having a direct-measuring impedance device (7) connected across a low-voltage terminal of the electrical apparatus (2) and an earth node (4), and an indirect-measuring impedance device (8) connected across the earth node (4) and a low voltage terminal of a coupling capacitor (6) connected in parallel to the electrical apparatus (2),
the instrument (1) wherein it comprises:
a first LF input stage (19) designed to
receive an analogue signal (10) picked up at the terminals of the direct-measuring impedance device (7) and representative of electrical pulses correlated with the partial discharges,
and to output a first LF digital signal (20) forming an uninterrupted sample flow representative of the pulses, the first LF input stage (19) forming a detection bandwidth of less than 2 MHz;
a first LF acquisition unit (27) connected to the first LF input stage (19) for receiving the first LF digital signal (20), and to a trigger module (14) for receiving a control signal (15) designed to allow samples of said flow to be selected according to a predetermined criterion, and configured to select from the flow of samples groups of samples forming segments corresponding to individual electrical pulses as a function of the control signal (15), thus generating a first LF digital acquisition signal (34);
a second LF input stage (19A) designed to
receive an analogue signal (32) picked up at the terminals of the indirect-measuring impedance device (8) and representative of electrical pulses correlated with the partial discharges,
and to output a second LF digital signal (20A) forming an uninterrupted sample flow representative of the pulses, the second LF input stage (19A) forming a detection bandwidth of less than 2 MHz;
a second LF acquisition unit (27A) connected to the second LF input stage (19A) for receiving the second LF digital signal (20A) and designed to receive the control signal (15) which allows samples of said flow to be selected according to a predetermined criterion, and configured to select from the flow of samples groups of samples forming segments corresponding to individual electrical pulses as a function of the control signal (15), thus generating a second LF digital acquisition signal (34A);

a processing block (35) designed to receive the first and second LF digital acquisition signals (34, 34A) to generate a balanced digital signal (36) without components representative of common mode electrical signals present in the measuring circuit;

an output stage (17) designed to receive the balanced digital signal (36) and to allow processing thereof.

2. The instrument according to claim 1, wherein the processing block (35) has access to a memory containing a transformation function such that the first LF digital acquisition signal (34) would coincide, except for the sign, with the second LF digital acquisition signal (34A) transformed by the transformation function, in the absence of the signals produced by components generated by common mode electric signals present in the measuring circuit, the balanced digital signal (36) being the difference between the first LF digital acquisition signal (34) and the second LF digital acquisition signal (34A) transformed by the transformation function, or vice versa.

3. The instrument according to claim 1, comprising:

an HF input stage (9) designed to receive the analogue signal (10) representative of electrical pulses correlated with the partial discharges and to output an HF digital signal (11) forming an uninterrupted sample flow representative of the full waveform of the pulses, said input stage (9) forming a detection bandwidth of at least 20 MHz;

an HF acquisition unit (16) connected to the HF input stage (9), for receiving the HF digital signal (11), and to the trigger module (14), for receiving the control signal (15), and configured to select from said sample flow groups of samples forming segments corresponding to individual electrical pulses as a function of the control signal (15), the trigger module (14) being connected to the HF input stage (9) for receiving the HF digital signal (11).

4. The instrument according to claim 1, wherein the first and second LF input stages (19, 19A) form a detection bandwidth of less than 500 kHz in order to comply with standards on the subject of partial discharge signal detection.

5. The instrument according to claim 3, comprising:

a processing unit (28) connected downstream of the HF acquisition unit for extracting substantially in real time the values of one or more predetermined parameters relating to the pulses acquired;

a filtering module (29) connected downstream of the processing module (28) for comparing the derived values with preset reference values and deriving a filtering signal (30) designed to disable substantially in real time the transfer to the output stage of the data relating to one or more pulses, as a function of the comparison, the LF acquisition units (27, 27A) being also connected to the filtering module (29) for receiving the filtering signal (30).

6. A method for detecting partial electric discharges in an electric apparatus (2) included in a measuring circuit having a direct-measuring impedance device (7) connected across a low-voltage terminal of the electrical apparatus (2) and an earth node (4), and an indirect-measuring impedance device (8) connected across the earth node (4) and a low voltage terminal of a coupling capacitor (6) connected in parallel to the electrical apparatus (2), wherein it comprises the following steps:

receiving, in a first LF input stage (19), a first analogue signal (10) picked up at the terminals of the direct-measuring impedance device (7) and representative of electrical pulses correlated with the partial discharges and outputting a first LF digital signal (20) forming an uninterrupted sample flow representative of the pulses, the first LF input stage (19) forming a bandwidth of less than 2 MHz;

selecting, from the first LF digital signal (20), through a first LF acquisition unit (27) that receives the first LF digital signal (20) and a control signal (15) designed to allow selection of samples of said flow according to a predetermined criterion, groups of samples forming segments corresponding to individual electrical pulses as a function of the control signal (15), thus generating a first LF digital acquisition signal (34);

receiving, in a second LF input stage (19A), a second analogue signal (32) picked up at the terminals of the indirect-measuring impedance device (8) and representative of electrical pulses correlated with the partial discharges and outputting a second LF digital signal (20A) forming an uninterrupted sample flow representative of the pulses, the second LF input stage (19A) forming a bandwidth of less than 2 MHz;

selecting, from the second LF digital signal (20A) through a second LF acquisition unit (27A) that receives the second LF digital signal (20A) and the control signal (15), groups of samples forming segments corresponding to individual electrical pulses as a function of the control signal (15), thus generating a second LF digital acquisition signal (34A);

processing the first and second LF digital acquisition signals (34, 34A) to generate a balanced digital signal (36) without components representative of common mode electrical signals present in the measuring circuit, so as to allow processing of said LF balanced digital signal (36).

7. The method according to claim 6, comprising a step of providing a transformation function such that the first LF digital acquisition signal (34) would coincide with the second LF digital acquisition signal (34A) transformed by the transformation function, in the absence of the signals produced by components generated by common mode electric signals present in the measuring circuit, the step of processing the first and second LF digital acquisition signals (34, 34A) involving subtraction of the second LF digital acquisition signal (34A), transformed by the transformation function, from the first LF digital acquisition signal (34), or vice versa, in order to derive the balanced digital signal (36).

8. The method according to claim 7, wherein the step of providing the transformation function comprises the following steps:

connecting a calibrator across a high-voltage terminal (5) of the electrical apparatus (2) and the earth node (4) in order to inject into the measuring circuit a calibration current signal;

generating a first and a second LF calibrating acquisition signal by applying the receiving and selecting steps to the calibrating signal;

deriving the transformation function according to the LF digital calibrating acquisition signal.

9. The method according to claim 6, comprising the following steps:

receiving, in an HF input stage (9) forming a detection bandwidth of at least 20 MHz, the analogue signal (10) representative of electrical pulses correlated with the partial discharges and outputting an HF digital signal (11) forming an uninterrupted sample flow representative of the full waveform of the pulses;

generating the control signal (15) designed to allow selection of a plurality of samples of the flow according to a predetermined criterion through the trigger module (14), the trigger module (14) receiving the HF digital signal (11);

selecting, from the flow of samples, groups of samples forming segments corresponding to individual electrical pulses as a function of the control signal (15), through an HF acquisition unit (16) that receives the HF digital signal (11) and the control signal (15);

processing the segments selected by the HF acquisition unit in order to derive, for each pulse, a value of at least one predetermined parameter relating to the waveform of the pulses, said value being correlated with a corresponding value of an amplitude parameter relating to the amplitude of that pulse, derived by processing the balanced LF digital signal (36).

10. The method according to claim 9, wherein:

the step of processing the segments selected by the HF acquisition unit (16) is performed substantially in real time and is followed by a step of comparing in real time the derived values with preset reference values, in order to derive a filtering signal (30) for disabling substantially in real time the transfer to output of the data relating to one or more pulses, as a function of the comparison, and wherein the step of selecting the first and second LF digital signals (26, 26A) is performed also as a function of the filtering signal (30).

* * * * *